US012622127B2

(12) United States Patent
Kim et al.

(10) Patent No.: US 12,622,127 B2
(45) Date of Patent: May 5, 2026

(54) PEROVSKITE OPTOELECTRONIC DEVICE AND MANUFACTURING METHOD THEREFOR

(71) Applicants: LG DISPLAY CO., LTD., Seoul (KR); SEOUL NATIONAL UNIVERSITY R&DB FOUNDATION, Seoul (KR)

(72) Inventors: Jin Young Kim, Paju-si (KR); Kiseok Chang, Paju-si (KR); Kwanghwan Ji, Paju-si (KR); Min-Ah Park, Paju-si (KR); Chong Rae Park, Paju-si (KR); Sae Jin Sung, Paju-si (KR)

(73) Assignees: LG Display Co., Ltd., Seoul (KR); Seoul National University R&DB Foundation, Seoul (KR)

( * ) Notice: Subject to any disclaimer, the term of this patent is extended or adjusted under 35 U.S.C. 154(b) by 784 days.

(21) Appl. No.: 17/788,639

(22) PCT Filed: Jul. 20, 2020

(86) PCT No.: PCT/KR2020/009521
§ 371 (c)(1),
(2) Date: Jun. 23, 2022

(87) PCT Pub. No.: WO2021/137377
PCT Pub. Date: Jul. 8, 2021

(65) Prior Publication Data
US 2023/0031667 A1 Feb. 2, 2023

(30) Foreign Application Priority Data
Dec. 30, 2019 (KR) ........................ 10-2019-0178075

(51) Int. Cl.
*H10K 30/82* (2023.01)
*H10K 30/85* (2023.01)
(Continued)

(52) U.S. Cl.
CPC ........... *H10K 30/821* (2023.02); *H10K 71/00* (2023.02); *H10K 85/111* (2023.02);
(Continued)

(58) Field of Classification Search
CPC .. H10K 30/821; H10K 85/221; H10K 85/211; H10K 85/20; H10K 85/50;
(Continued)

(56) References Cited

U.S. PATENT DOCUMENTS 9,576,707 B2 2/2017 Lee et al.
10,229,791 B2 3/2019 Kim et al.
(Continued)

FOREIGN PATENT DOCUMENTS

KR 10-1160909 B1 6/2012
KR 10-2013-0054734 A 5/2013
(Continued)

OTHER PUBLICATIONS

PCT International Search Report and Written Opinion, PCT Application No. PCT/KR2020/009521, Nov. 4, 2020, 12 pages (with English translation of PCT International Search Report).
(Continued)

*Primary Examiner* — Moazzam Hossain
(74) *Attorney, Agent, or Firm* — Fenwick & West LLP

(57) ABSTRACT

The present invention relates to a perovskite optoelectronic device and a manufacturing method therefor. The present invention allows manufacture of a perovskite optoelectronic device with high efficiency at a low cost, as well as improving the electrical conductivity of a carbon nanotube electrode, by laying graphene oxide over conventional carbon nanotubes and may also be applied to a flexible device.

9 Claims, 6 Drawing Sheets

(51) Int. Cl.

| | |
|---|---|
| *H10K 30/86* | (2023.01) |
| *H10K 71/00* | (2023.01) |
| *H10K 85/10* | (2023.01) |
| *H10K 85/20* | (2023.01) |
| *H10K 85/50* | (2023.01) |
| *H10K 85/60* | (2023.01) |
| *H10K 102/00* | (2023.01) |
| *H10K 77/10* | (2023.01) |

(52) U.S. Cl.
CPC ....... *H10K 85/1135* (2023.02); *H10K 85/211* (2023.02); *H10K 85/221* (2023.02); *H10K 85/633* (2023.02); *H10K 30/85* (2023.02); *H10K 30/86* (2023.02); *H10K 77/111* (2023.02); *H10K 85/50* (2023.02); *H10K 2102/00* (2023.02)

(58) Field of Classification Search
CPC ........ H10K 71/00; H10K 30/85; H10K 30/86; H10K 85/30; Y10S 977/812; Y10S 502/525; H01L 21/31691; H01L 21/02197
See application file for complete search history.

(56) References Cited

U.S. PATENT DOCUMENTS

| | | | |
|---|---|---|---|
| 2013/0092238 A1* | 4/2013 | Ogata ................... | H10F 77/147 |
| | | | 438/82 |
| 2013/0130037 A1* | 5/2013 | Bol .................... | H10D 30/6713 |
| | | | 977/734 |
| 2018/0122584 A1* | 5/2018 | Kim ....................... | H10K 85/50 |
| 2019/0189944 A1* | 6/2019 | Shirokane ............. | H10K 30/87 |
| 2020/0157355 A1* | 5/2020 | Irwin ....................... | C09D 1/00 |
| 2020/0176618 A1 | 6/2020 | Ahn et al. | |
| 2020/0381183 A1* | 12/2020 | Christensen ......... | H10K 71/421 |

FOREIGN PATENT DOCUMENTS

| | | |
|---|---|---|
| KR | 10-1776533 B1 | 9/2017 |
| KR | 10-2018-0022734 A | 3/2018 |
| KR | 10-2019-0010197 A | 1/2019 |

OTHER PUBLICATIONS

Han, S. et al. "Mechanical and Electrical Properties of Graphene and Carbon Nanotube Reinforced Epoxy Adhesives: Experimental and Numerical Analysis." Composites Part A: Applied Science and Manufacturing, vol. 120, May 2019, pp. 116-126.

* cited by examiner

[FIG. 1]
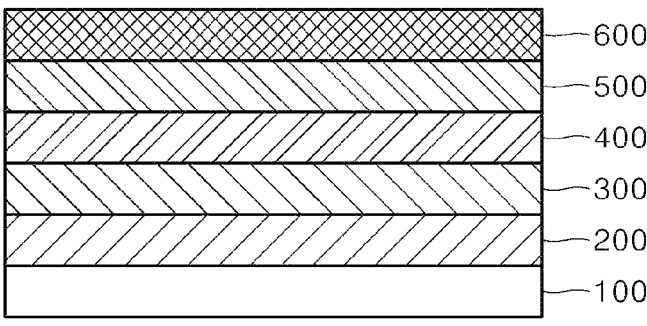
[FIG. 2]
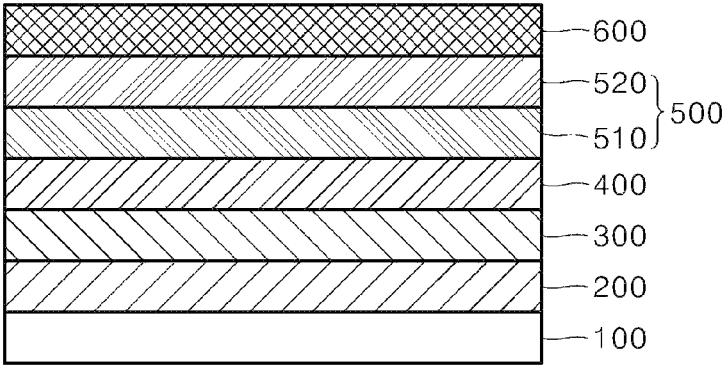
[FIG. 3]
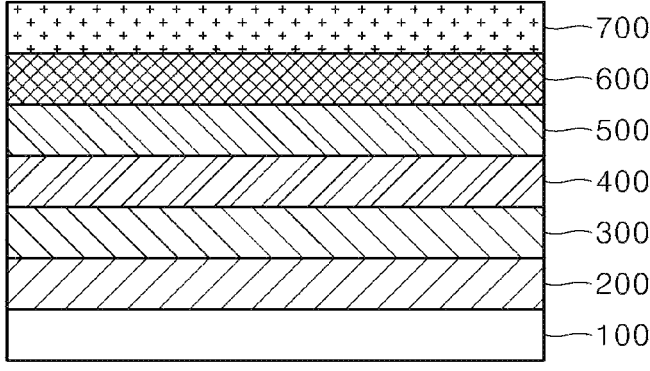

[FIG. 8]
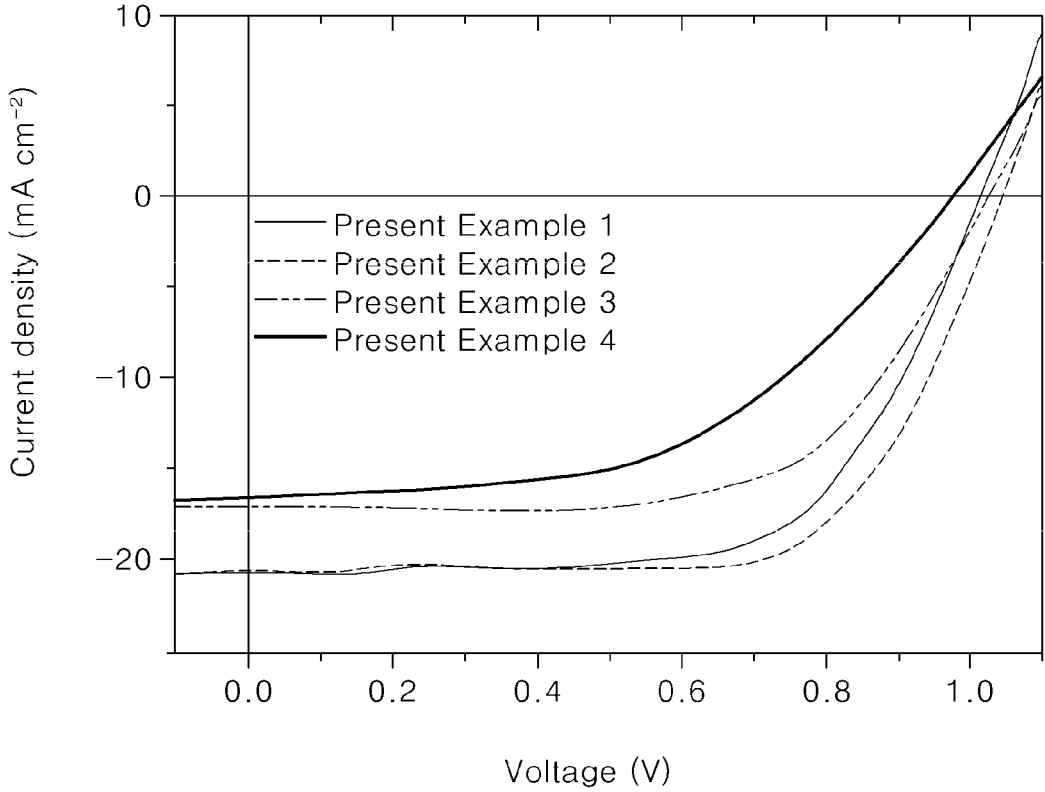

PEROVSKITE OPTOELECTRONIC DEVICE AND MANUFACTURING METHOD THEREFOR

TECHNICAL FIELD

The present disclosure relates to a perovskite optoelectronic device and a method for manufacturing the same.

DESCRIPTION OF THE RELATED ART

Recently, an organic-inorganic composite perovskite device with a high light absorption coefficient and a long-distance balanced carrier diffusion length is attracting attention as an optoelectronic device.

In the organic-inorganic composite perovskite device, indium tin oxide (ITO) is used as a transparent electrode, and a metal thin film is used as a top electrode. Materials of the electrodes have excellent electrical conductivity, so that the efficiency of the optoelectronic device may be maximized.

However, the materials are impractical due to an expensive cost, a complicated process thereof, and a limited production throughput. In particular, it is difficult to apply the ITO electrode to a flexible device due to limitation of mechanical durability thereof

DISCLOSURE

Technical Purposes

Carbon materials such as graphite, graphene, carbon black, and carbon nanotubes are used as materials for the optoelectronic device to compensate for the problems of the ITO electrodes and the metal thin film. The carbon material has excellent electrical, optical, and mechanical properties, while having a low production cost, enabling a liquid phase process, and easy mass production.

However, despite a fact that the carbon material has an advantage as a material for a perovskite device, the carbon material has limitations in terms of application thereof to the perovskite device.

First, a carbon black and graphite mixture has low conductivity and thus a thick film made thereof is essential. Thus, the carbon black and graphite mixture may not be applied to a transparent electrode.

Second, electrodes using the graphene are manufactured through chemical vapor deposition (CVD), and thus requires high cost. Thus, commercialization thereof may be not easy.

Third, although it is possible to fabricate a transparent electrode using carbon nanotubes, there is a problem in that it is difficult to directly use the carbon nanotubes in the perovskite device due to high roughness of a carbon nanotube network and low electrical conductivity thereof compared to those of the ITO electrode and the metal thin film. In particular, in order to apply the carbon nanotubes to an upper electrode of the optoelectronic device, a thick film of 50 nm or greater is required. Thus, it is difficult to use the carbon nanotubes in applications such as translucent devices.

A purpose of the present disclosure is to provide a perovskite optoelectronic device capable of improving electrical conductivity while using carbon nanotubes and a method for manufacturing the same.

Further, a purpose of the present disclosure is to provide a perovskite optoelectronic device capable of removing a problem due to the high roughness of a carbon nanotube network and a method for manufacturing the same.

Further, a purpose of the present disclosure is to provide a perovskite optoelectronic device in which carbon nanotubes are applied to an upper electrode as well as a lower electrode and thus are utilized in applications such as translucent devices, and a method for manufacturing the same.

The purposes of the present disclosure are not limited to the above-mentioned purposes, and other purposes and advantages of the present disclosure that are not mentioned may be understood based on following descriptions, and more clearly understood from embodiments of the present disclosure. Further, it will be readily apparent that the purpose and advantages of the present disclosure may be realized by means and combinations thereof indicated in claims.

Technical Solutions

One aspect of the present disclosure provides a perovskite optoelectronic device comprising: a substrate; a lower electrode disposed over the substrate; an electron transport layer disposed over the lower electrode; a light absorption layer disposed over the electron transport layer, and including perovskite; a hole transport layer disposed over the light absorption layer; and an upper electrode disposed over the hole transport layer, wherein at least one of the lower electrode and the upper electrode includes graphene oxide stacked on the carbon nanotubes.

One aspect of the present disclosure provides a method for manufacturing a perovskite optoelectronic device, the method comprising: (a) sequentially stacking a lower electrode, an electron transport layer, and a light absorption layer including perovskite on a first substrate in this order to form a first stack; (b) sequentially stacking carbon nanotubes, graphene oxide, and a hole transport layer on a second substrate in this order to form a second stack; and (c) forming the second stack in the (b) on the first stack in the (a).

Technical Effects

According to the present disclosure, a graphene oxide having an electron-withdrawing group (EWG) is stacked on the carbon nanotube, thereby improving the electrical conductivity of the carbon nanotube electrode.

Further, according to the present disclosure, a geometrically flat graphene oxide is stacked on the carbon nanotube, such that the problem due to the high roughness of the carbon nanotube may be improved.

Further, according to the present disclosure, the electrical conductivity of the carbon nanotube electrode is improved. Thus, even when the carbon nanotube is applied to the upper electrode, a thick film of 50 nm or greater made thereof is not necessarily required. Thus the carbon nanotube may be utilized in applications such as translucent devices.

Further, according to the present disclosure, when the upper electrode formed of the carbon nanotubes is attached to the device, a substrate still remains in the device, thereby dramatically improving a lifespan of the perovskite optoelectronic device using a glass substrate. Further, the perovskite optoelectronic device using a flexible polymer substrate may be applied as a flexible device.

Further, the perovskite optoelectronic device using the carbon nanotube electrode according to the present disclosure may be mass-produced because an entire manufacturing process thereof may be unified as a liquid-phase technique. The entire manufacturing process thereof is carried out at 150 degrees C. or lower, such that there is no limitation in terms of selection of the substrate. Further, the perovskite optoelectronic device according to the present disclosure may be practically utilized because a cost of each of materials thereof is low.

In addition to the above-described effects, specific effects of the present disclosure will be described in describing specific details for carrying out the disclosure.

BRIEF DESCRIPTION OF DRAWINGS

FIG. 1 schematically shows a cross-section of a perovskite optoelectronic device according to an embodiment of the present disclosure.

FIG. 2 schematically shows a cross-section of a perovskite optoelectronic device according to another embodiment of the present disclosure.

FIG. 3 schematically shows a cross-section of a perovskite optoelectronic device according to still another embodiment of the present disclosure.

FIG. 8 shows measurement results of current density-voltage (J-V) of a perovskite optoelectronic device manufactured according to each of Present Example 1 to Present Example 4.

DETAILED DESCRIPTIONS

Figure 4:
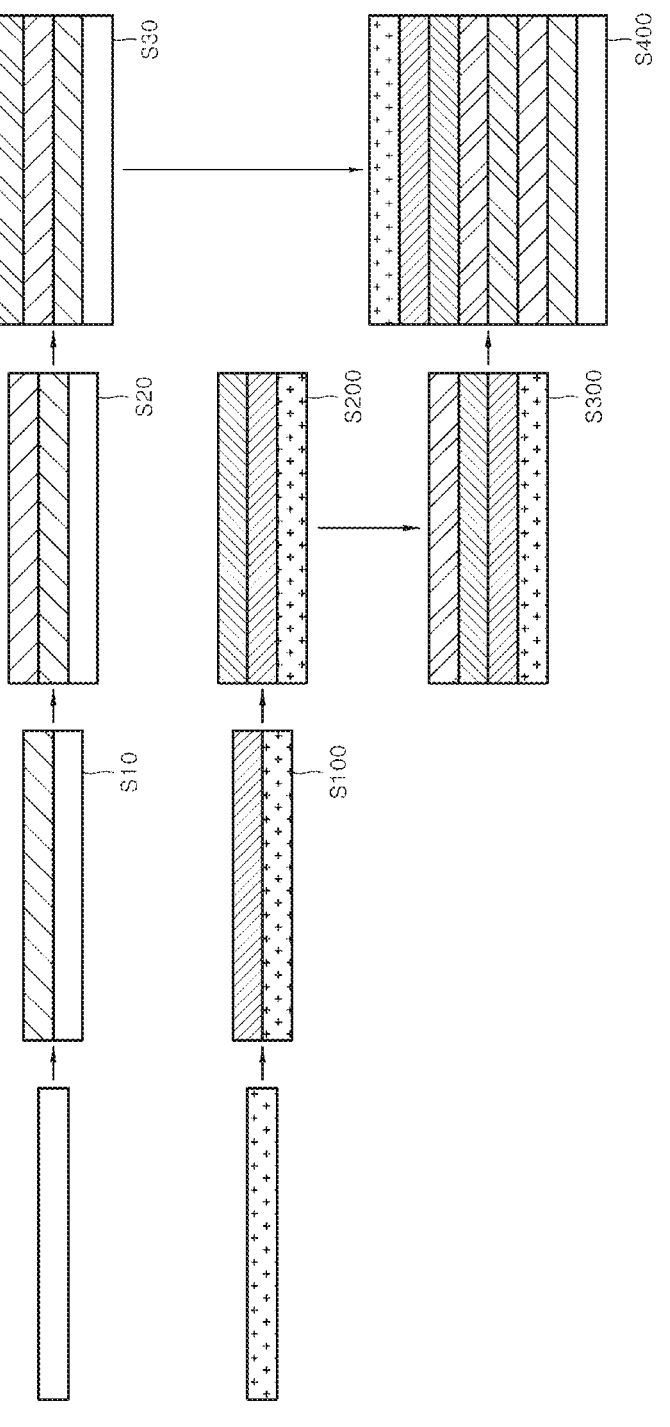
FIG. 4 schematically shows a method for manufacturing a perovskite optoelectronic device in which a structure in which graphene oxide is stacked on carbon nanotubes is included in an upper electrode.

The above-described purpose, features and advantages will be described later in detail with reference to the accompanying drawings. Accordingly, a person of ordinary skill in the art to which the present disclosure belongs will be able to easily implement the technical idea of the present disclosure. In describing the present disclosure, when it is determined that detailed descriptions of known elements or steps related to the present disclosure may unnecessarily obscure the gist of the present disclosure, the detailed descriptions will be omitted. Hereinafter, a preferred embodiment according to the present disclosure will be described in detail with reference to the accompanying drawings. In the drawings, the same reference numerals are used to indicate the same or similar components.

In addition, it will also be understood that when a first element or layer is referred to as being present "over" or "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Perovskite Optoelectronic Device

Hereinafter, a perovskite optoelectronic device according to some embodiments of the present disclosure will be described.

FIG. 1 schematically shows a cross-section of a perovskite optoelectronic device according to an embodiment of the present disclosure.

Referring to FIG. 1, the perovskite optoelectronic device according to an embodiment of the present disclosure includes a lower electrode 200 disposed over a substrate 100, an electron transport layer 300 disposed over the lower electrode, a light absorption layer 400 disposed over the electron transport layer, and including perovskite, a hole transport layer 500 disposed over the light absorption layer, and an upper electrode 600 disposed over the hole transport layer. At least one of the lower electrode and the upper electrode includes a graphene oxide stacked on carbon nanotubes.

The substrate 100 may be a glass substrate, a semiconductor substrate, a plastic substrate, or a flexible substrate formed of a polymer material.

The lower electrode 200 is disposed over the substrate 100. The lower electrode 200 may be formed of a conductive polymer, a conductive metal oxide such as indium tin oxide (ITO) or fluorine-doped tin oxide (FTO), but is not necessarily limited thereto. For example, the lower electrode 200 may be formed of graphene, carbon nanotubes, reduced graphene oxide, metal nanowire, or metal grid.

The lower electrode 200 may be deposited over the substrate 100 using a deposition process including physical vapor deposition (PVD), chemical vapor deposition (CVD), sputtering, pulsed laser deposition (PLD), thermal evaporation, electron beam evaporation, atomic layer deposition (ALD), or molecular beam epitaxy (MBE).

The electron transport layer 300 is disposed over the lower electrode 200. The electron transport layer 300 may be formed of, for example, polyethyleneimine or a fullerene-based material such as $C_{60}$.

The electron transport layer 300 may be deposited over the lower electrode 200 using a vacuum thermal deposition process.

The electron transport layer 300 should be formed to a predetermined thickness or greater, for example, may be formed to have a thickness of 20 nm to 100 nm. When the thickness of the electron transport layer 300 is smaller than 20 nm, electron migration may be smooth, but blocking effect of holes may be reduced, and thus power conversion efficiency (PCE) may be reduced. When the thickness of the electron transport layer 300 is greater than 100 nm, internal resistance to electron migration may occur.

In particular, at least one of the lower electrode 200 and the upper electrode 600 of the perovskite optoelectronic device according to the present disclosure includes carbon nanotubes. An energy level of the carbon nanotubes may not be suitable for direct use thereof in the light absorption layer 400. Accordingly, the perovskite optoelectronic device according to the present disclosure includes the electron transport layer 300 such that the energy level of the carbon nanotube is adjusted to be suitable for use in the light absorption layer 400.

The light absorption layer 400 includes perovskite, and is disposed over the electron transport layer 300. The perovskite may be a metal halide perovskite material.

In this regard, the metal halide perovskite may have a composition of $ABX_3$, $A_2BX_4$, $ABX_4$ or $a_{n-1}Pb_nI_{3n+1}$ (n is an integer between 2 and 6), where A may be a monovalent organic cation or a monovalent metal cation, B may be a divalent metal ion, and X may be a monovalent halide ion.

For example, A may be an amidinium-based organic ion, an organic ammonium cation, or a monovalent alkali metal cation, and B may be Pb, Mn, Cu, Ga, Ge, In, Al, Sb, Bi, Po, Sn, Eu, Yb, Ni, Co, Fe, Cr, Pd, Cd, Ca, Sr, or a combination thereof, and X may be Cl, Br, I, or a combination thereof.

A crystal structure of the metal halide perovskite may be a face centered cubic (FCC) structure in which a metal M is positioned at a center of each face, and 6halogen element Xs are located at each of all surfaces of a cube, or a body centered cubic (BCC) structure in which 8 organic ammoniums $(RNH_3)$ are located at each of all vertices of the cube.

In this regard, the crystal structure may include a cube structure in which all of faces of the cube interest with each other at 90°, and a length, a width, and a height are equal to each other, and a tetragonal structure in which all of faces thereof interest with each other at 90°, and a length and a width are equal to each other, and a height is different from each of a length and a width.

Further, the metal halide perovskite may have a perovskite crystal structure obtained by mixing an organic material and an inorganic material with each other. The organic material and the inorganic material of the metal halide perovskite may be $CH_3NH_3$, Pb, and X (Cl, Br or I), respectively. However, the disclosure may not be necessarily limited thereto. For example, the metal halide perovskite may be $CH_3NH_3PbBr_3$, $CH_3NH_3PbBr_{3-x}I_x$, or $CH_3NH_3PbBr_{3-x}Cl_x$.

The metal halide perovskite may include a structure of $A_2BX_4$, $ABX_4$ or $A_{n-1}Pb_nI$ (n is an integer between 2 and 6) having a lamellar two-dimensional structure. In this regard, A is an organic ammonium material, B is a metal material, and X is a halogen element.

For example, A may be $(CH_3NH_3)_n$, $((C_xH_{2x+1})_nNH_3)_2$ $(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ or $(C_nF_{2n+1}NH_3)_2$ (n is an integer greater than or equal to 1). B may be divalent transition metal, rare earth metal, alkaline earth metal, Pb, Sn, Ge, Ga, In, Al, Sb, Bi, Po, or a combination thereof. In this regard, the rare earth metal may be Ge, Sn, Pb, Eu or Yb, and the alkaline earth metal may be Ca or Sr. X may be Cl, Br, I, or a combination thereof A thickness of the light absorption layer 400 may be equal or less than 500 nm, preferably less than 150 nm.

The hole transport layer 500 is disposed over the light absorption layer 400. The hole transport layer 500 may be formed to transport holes and binds to the light absorption layer 400, and may be formed of a p-type organic semiconductor or a conductive polymer material. In one example, the hole transport layer 500 may include Spiro-OMETAD (2,2',7,7'-tetrakis(N,N-di-p-methoxyphenylamino)-9,9'-spirobifluorene) and PEDOT:PSS (poly(3,4-ethylenedioxythiophene) poly(styrene sulfonate)). Referring to FIG. 2, the hole transport layer 500 may include a plurality of layers including a first hole transport layer 510 and a second hole transport layer 520 disposed over the first hole transport layer. In this regard, the first hole transport layer 510 may include Spiro-OMETAD(2,2',7,7'-tetrakis(N,N-di-p-methoxyphenylamino)-9,9'-spirobifluorene), while the second hole transport layer 520 may include PEDOT:PSS (poly(3,4-ethylenedioxythiophene)poly(styrene sulfonate)).

The perovskite optoelectronic device according to the present disclosure includes the hole transport layer 500 including the first hole transport layer 510 and the second hole transport layer 520, thereby further increasing an open circuit voltage and a fill factor. Specifically, when single PEDOT:PSS (poly(3,4-ethylenedioxythiophene)poly(styrene sulfonate)) is coated on the carbon electrode of the perovskite optoelectronic device, a work function may be about 5.0 eV. On the contrary, a HOMO level of $MAPbI_3$ which may be used as a light absorption layer in the perovskite optoelectronic device may be about 5.4 eV. That is, the PEDOT:PSS bonded to the light absorption layer may have a low open circuit voltage and a low fill factor due to a potential energy barrier (Schottky barrier) for electrons formed in a metal-semiconductor coupling. In this regard, in the perovskite optoelectronic device according to the present disclosure the hole transport layer including the single PEDOT:PSS may further include Spiro-OMETAD (2,2',7, 7'-tetrakis(N,N-di-p-methoxyphenylamino)-9,9'-spirobifluorene). A HOMO level of the Spiro-OMETAD may be about 5.22 eV. In other words, the Spiro-OMETAD which is additionally introduced into the hole transport layer and is bonded to the light absorption layer may lower the potential energy barrier for electrons formed in the metal-semiconductor coupling, thereby causing increase in the open circuit voltage and the fill factor.

Thus, the perovskite optoelectronic device according to the present disclosure may include a sequentially stacked structure of the first hole transport layer 510 including the Spiro-OMETAD (2,2',7,7'-tetrakis(N,N-di-p-methoxyphenylamino)-9,9'-spirobifluorene) and the second hole transport layer 520 including the PEDOT:PSS (poly(3,4-ethylenedioxythiophene)poly(styrene sulfonate)) on the light absorption layer 400. Thus, device efficiency may be further increased.

In the perovskite optoelectronic device according to the present disclosure, at least one of the lower electrode 200 and the upper electrode 600 includes a structure in which graphene oxide is deposited on carbon nanotubes.

The carbon nanotube (CNT) refers to an allotrope of carbon having a cylindrical nanostructure. Types of the carbon nanotubes may include single-walled carbon nanotubes, double-walled carbon nanotubes, multi-walled carbon nanotubes, carbon nanohorns, and carbon nanofibers. In one example, the carbon nanotubes in accordance with the present disclosure may be single-walled carbon nanotubes.

The graphene oxide (GO) has a chemical structure in which oxidation occurs in a graphene structure. A graphene oxide sheet has an electron withdrawing group (EWG) such as a hydroxyl group, an epoxy group, a carbonyl group, and a carboxyl group. When the graphene oxide is deposited on the carbon nanotube, it acts as a p-type dopant to the carbon nanotube due to an effect of withdrawing the electrons. Thus, doping occurs, and at the same time, electrical conductivity of the carbon nanotube electrode may be increased.

Further, the carbon nanotube is a material having an aspect ratio of 1000 or greater. When the carbon nanotubes are stacked with each other so as to be used as an electrode, there is a problem in that a surface roughness of the stacked carbon nanotubes is significantly increased due to a geometric feature having the high aspect ratio. The graphene oxide is a material derived from flat graphene unlike the carbon nanotubes. Accordingly, the structure in which the graphene oxide is deposited on the carbon nanotubes has an effect of allowing a surface of the electrode to be smooth.

Thus, the structure in which the graphene oxide is deposited on the carbon nanotube may improve the electrical conductivity of the electrode, and has the effect of reducing the high roughness of the carbon nanotube.

The structure in which the graphene oxide is deposited on the carbon nanotube is included in at least one of the lower electrode 200 and the upper electrode 600 in the perovskite optoelectronic device.

In one example, the structure in which the graphene oxide is deposited on the carbon nanotubes may be included in the lower electrode 200. In this case, the perovskite optoelectronic device according to the present disclosure may have a structure in which the carbon nanotubes, the graphene oxide, the electron transport layer, the light absorption layer, the hole transport layer, and the upper electrode are sequentially stacked over the substrate. In this regard, the upper electrode 600 may include at least one or more of platinum (Pt), gold (Au), aluminum (Al), nickel (Ni), copper (Cu), silver (Ag), indium (In), ruthenium (Ru), palladium (Pd), rhodium (Rh), iridium (Ir) and osmium (Os).

In another example, the structure in which the graphene oxide is deposited on the carbon nanotubes may be included in the upper electrode 600. In this case, the perovskite optoelectronic device according to the present disclosure may have a structure in which the lower electrode, the electron transport layer, the light absorption layer, the hole transport layer, the graphene oxide and the carbon nanotubes are sequentially stacked on the substrate. In this regard, the lower electrode 200 may be formed of indium tin oxide (ITO), but is not necessarily limited thereto.

Further, the hole transport layer 500 may include a plurality of layers including a layer formed of Spiro-OMETAD (2,2',7,7'-tetrakis(N,N-di-p-methoxyphe-nylamino)-9,9'-spirobifluorene) and a layer formed of PEDOT:PSS (poly(3,4-ethylenedioxythiophene) poly(sty-rene sulfonate)). In this case, the perovskite optoelectronic device according to the present disclosure may include a structure in which the lower electrode, the electron transport layer, the light absorption layer, the layer formed of Spiro-OMETAD (2,2',7,7'-tetrakis (N,N-di-p-methoxyphe-nylamino)-9,9'-spirobifluorene), the layer formed of EDOT:PSS (poly(3,4-ethylenedioxythiophene)poly(styrene sulfonate)), the graphene oxide, and the carbon nanotubes may be sequentially stacked on the substrate.

In another example, the structure in which the graphene oxide is deposited on the carbon nanotubes may be included in each of the lower electrode 200 and the upper electrode 600. In this case, the perovskite optoelectronic device according to the present disclosure may have a structure in which the carbon nanotubes, the graphene oxide, the electron transport layer, the light absorption layer, the hole transport layer, the graphene oxide, and the carbon nanotubes are sequentially stacked on the substrate.

In this regard, the hole transport layer 500 may include a plurality of layers including a layer formed of Spiro-OMETAD (2,2',7,7'-tetrakis(N,N-di-p-methoxyphe-nylamino)-9,9'-spirobifluorene) and a layer formed of PEDOT:PSS (poly(3,4-ethylenedioxythiophene) poly(sty-rene sulfonate)). In this case, the perovskite optoelectronic device according to the present disclosure may have a structure in which the carbon nanotube, the graphene oxide, the electron transport layer, the light absorption layer, the layer formed of Spiro-OMETAD (2,2',7,7'-tetrakis (N,N-di-p-methoxyphenylamino)-9,9'-spirobifluorene), the layer formed of PEDOT:PSS (poly(3,4-ethylenedioxythiophene) poly(styrene sulfonate)), the graphene oxide, and the carbon nanotubes may be sequentially stacked on the substrate.

Referring to FIG. 3, the perovskite optoelectronic device according to the present disclosure may further include a further substrate 700 disposed over the upper electrode 600. The substrate 700 may be a polymer substrate. In one example, the substate 700 may be formed of polyethylene terephthalate (PET) or polyethylene naphthalate (PEN), but is not necessarily limited thereto.

Hereinafter, specific examples of the present disclosure are presented. However, the examples as described below are only for specifically illustrating or describing the present disclosure, and thus the present disclosure should not be limited thereto.

Method for Manufacturing Perovskite Optoelectronic Device

Hereinafter, a method for manufacturing a perovskite optoelectronic device according to some embodiments of the present disclosure will be described.

A method for manufacturing a perovskite optoelectronic device according to an embodiment of the present disclosure includes (a) sequentially stacking a lower electrode, an electron transport layer, and a light absorption layer including perovskite on a first substrate to produce a first stack, (b) sequentially stacking carbon nanotubes, graphene oxide, and a hole transport layer on a second substrate to produce a second stack, and (c) forming the second stack on the first stack.

FIG. 4 schematically shows a method for manufacturing a perovskite optoelectronic device in which a structure in which graphene oxide is deposited on carbon nanotubes is included in the upper electrode.

Referring to FIG. 4, first, a lower electrode is formed on the first substrate in S10.

The first substrate may be a glass substrate, a semiconductor substrate, a plastic substrate, or a flexible substrate formed of a polymer material, preferably a glass substrate. The lower electrode may be formed of a conductive polymer, or a conductive metal oxide such as indium tin oxide (ITO), or fluorine-doped tin oxide (FTO), preferably indium tin oxide (ITO). The lower electrode may be deposited on the first substrate using a deposition process such as physical vapor deposition (PVD), chemical vapor deposition (CVD), sputtering, pulsed laser deposition (PLD), thermal evaporation, electron beam evaporation, atomic layer deposition (ALD), or molecular beam epitaxy (MBE). A thickness of the deposited lower electrode may be in a range of 50 nm to 500 nm.

Next, an electron transport layer is formed on the lower electrode in S20.

The electron transport layer may be formed of polyethyleneimine or a fullerene based material such as $C_{60}$. The electron transport layer may be deposited on the lower electrode through a vacuum thermal evaporation process.

Next, a light absorption layer is formed on the electron transport layer in S30.

The light absorption layer includes perovskite, wherein the perovskite may be a metal halide perovskite material. In one example, the light absorption layer may be formed of methylammonium lead iodide (MAPbI$_3$). A thickness of the deposited light absorption layer may be in a range of 300 nm to 700 nm.

A first stack in which the lower electrode, the electron transport layer, and the light absorption layer including the perovskite are sequentially stacked on the first substrate may be manufactured in S10, S20, and S30.

Next, carbon nanotubes are formed on a second substrate separately from the first stack in S100.

The second substrate may be a polymer substrate, and in one example, the second substrate may be formed of polyethylene terephthalate (PET) or polyethylene naphthalate (PEN).

The carbon nanotubes may be single-walled carbon nanotubes. The carbon nanotubes may be coated on the second substrate in a form of a film.

Next, graphene oxide is formed on the carbon nanotubes in S200.

The graphene oxide may be coated on the carbon nanotube film using spin coating. A thickness of the graphene oxide may be in a range of 1 nm or smaller.

Next, a hole transport layer is formed on the graphene oxide in S300.

The hole transport layer may act for smooth hole transport and bonding of the optoelectronic device, and may be formed of a p-type organic semiconductor or a conductive polymer material. In one example, the hole transport layer may be formed of PEDOT:PSS (poly(3,4-ethylenedioxythiophene) poly(styrene sulfonate)). A thickness of the deposited hole transport layer may be in a range of 50 nm to 300 nm.

A second stack in which the carbon nanotubes, the graphene oxide, and the hole transport layer are sequentially stacked on the second substrate may be manufactured in S100, S200, and S300.

Thereafter, the second stack may be disposed over the first stack. Thus, the perovskite optoelectronic device including the structure in which the graphene oxide is deposited on the carbon nanotube on the upper electrode may be manufactured in S400.

A method for manufacturing a perovskite optoelectronic device according to another embodiment of the present disclosure includes (a) sequentially stacking a lower electrode, an electron transport layer, and a light absorption layer including perovskite, and a first hole transport layer on a first substrate to form a first stack, (b) sequentially stacking carbon nanotubes, graphene oxide, and a second hole transport layer on a second substrate to form a second stack, and (c) forming the second stack on the first stack.

Figure 5:
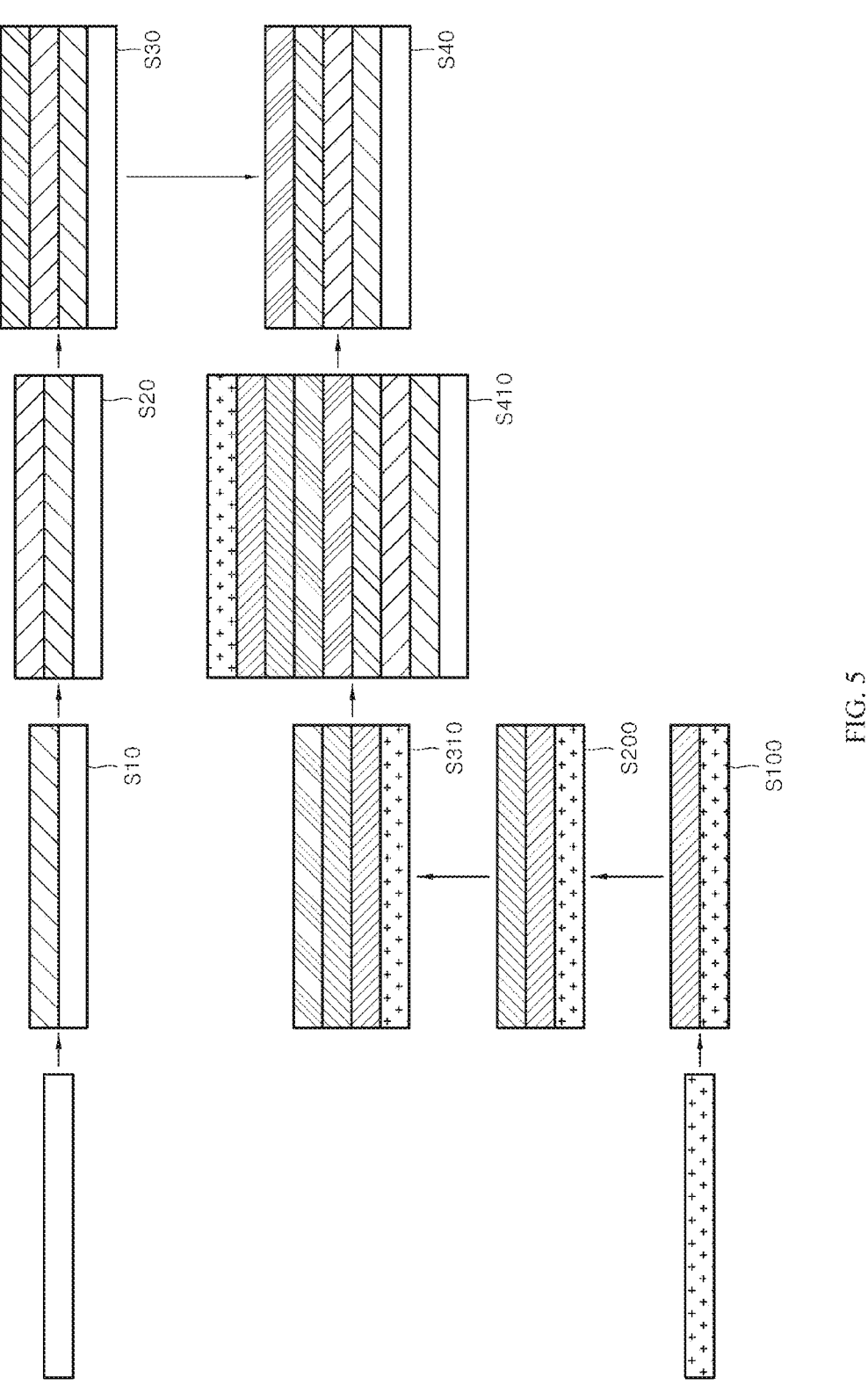
FIG. 5 schematically shows a method for manufacturing a perovskite optoelectronic device including a first hole transport layer and a second hole transport layer.

FIG. 5 schematically shows a method for manufacturing a perovskite optoelectronic device including the first hole transport layer and the second hole transport layer.

Referring to FIG. 5, first, a lower electrode, an electron transport layer, and a light absorption layer including perovskite are sequentially stacked on a first substrate in S10, S20, and S30.

Next, a first hole transport layer is formed on the light absorption layer in S40.

The first hole transport layer may be formed of Spiro-OMETAD (2,2',7,7'-tetrakis(N,N-di-p-methoxyphenylamino)-9,9'-spirobifluorene). A HOMO level of the Spiro-OMETAD (2,2',7,7'-tetrakis(N,N-di-p-methoxyphenylamino)-9,9'-spirobifluorene) is about 5.22 eV. This HOMO level is lower compared to a HOMO level of PEDOT:PSS (poly(3,4-ethylenedioxythiophene)poly(styrene sulfonate)) used as the hole transport layer. Accordingly, the Spiro-OMETAD bonded to the light absorption layer lowers the potential energy barrier for electrons formed in the metal-semiconductor coupling, thereby causing increase in the open circuit voltage and the fill factor.

A first stack in which the lower electrode, the electron transport layer, the light absorption layer, and the first hole transport layer are sequentially stacked on the first substrate may be manufactured in S10, S20, S30, and S40.

Next, carbon nanotubes and graphene oxide are sequentially stacked on a second substrate in S100 and S200, separately from the first stack.

Next, a second hole transport layer is formed on the graphene oxide in S310.

The second hole transport layer may be formed of PEDOT:PSS (poly(3,4-ethylenedioxythiophene)poly(styrene sulfonate)).

A second stack in which the carbon nanotubes, the graphene oxide, and the second hole transport layer are sequentially stacked on the second substrate may be manufactured in S100, S200, and S310.

Thereafter, the second stack is disposed over the first stack. Thus, a perovskite optoelectronic device including the structure in which the graphene oxide is deposited on the carbon nanotube on the upper electrode, and including the hole transport layer the first hole transport layer and the second hole transport layer may be manufactured in S410.

A method for manufacturing a perovskite optoelectronic device according to still another embodiment of the present disclosure includes (a) forming carbon nanotubes on a first substrate, (b) forming graphene oxide on the carbon nanotubes, (c) forming an electron transport layer on the graphene oxide, (d) forming a light absorption layer including perovskite on the electron transport layer, (e) forming a hole transport layer on the light absorption layer and (f) forming an upper electrode on the hole transport layer.

Figure 6:
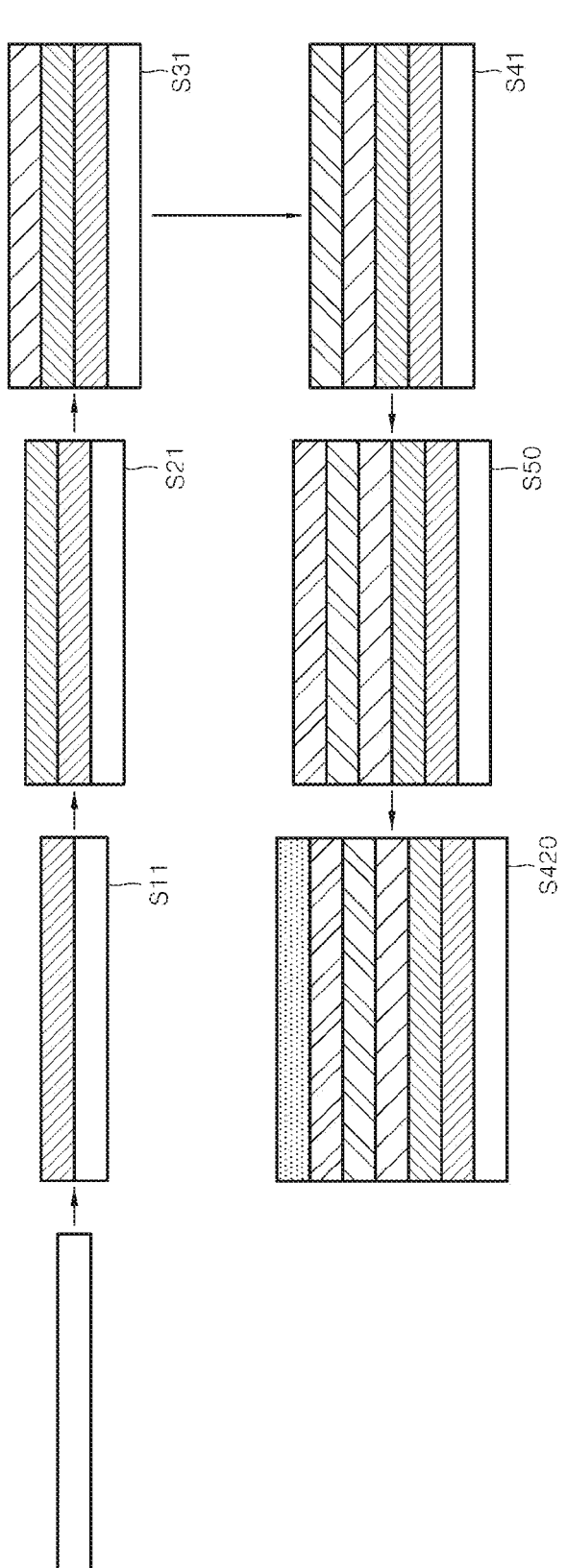
FIG. 6 schematically shows a method for manufacturing a perovskite optoelectronic device in which a structure in which graphene oxide is stacked on carbon nanotubes is included in a lower electrode.

FIG. 6 schematically shows a method for manufacturing a perovskite optoelectronic device in which a structure in which graphene oxide is deposited on carbon nanotubes is included in the lower electrode.

Referring to FIG. 6, first, carbon nanotubes are formed on a first substrate in S11. Preferably, the first substrate may be a glass substrate.

Next, graphene oxide is formed on the carbon nanotube in S21, and an electron transport layer is formed on the graphene oxide in S31. The electron transport layer may be formed of polyethyleneimine or a fullerene-based material, preferably, polyethyleneimine.

Next, a light absorption layer including perovskite is formed on the electron transport layer in S41, and a hole transport layer is formed on the light absorption layer in S50. The hole transport layer may be formed of a p-type organic semiconductor or a conductive polymer material, preferably Spiro-OMETAD(2,2',7,7'-tetrakis(N,N-di-p-methoxyphenylamino)-9,9'-spirobifluorene).

Next, an upper electrode is formed on the hole transport layer to manufacture a perovskite optoelectronic device in S420. In this regard, the upper electrode may be formed of at least one selected from platinum (Pt), gold (Au), aluminum (Al), nickel (Ni), copper (Cu), silver (Ag), indium (In), ruthenium (Ru), palladium (Pd)), rhodium (Rh), iridium (Ir), and osmium (Os). The perovskite optoelectronic device of the present disclosure has the advantage of being able to implement a transparent electrode that allows light to pass therethrough even when the upper electrode is formed of an opaque metal.

A method for manufacturing a perovskite optoelectronic device according to still another embodiment of the present disclosure includes (a) sequentially stacking carbon nanotubes, graphene oxide, an electron transport layer, and a light absorption layer including perovskite, and a first hole transport layer on a first substrate to form a first stack, (b) sequentially stacking carbon nanotubes, graphene oxide, and a second hole transport layer on a second substrate to form a second stack, and (c) disposing the second stack on the first stack.

Figure 7:
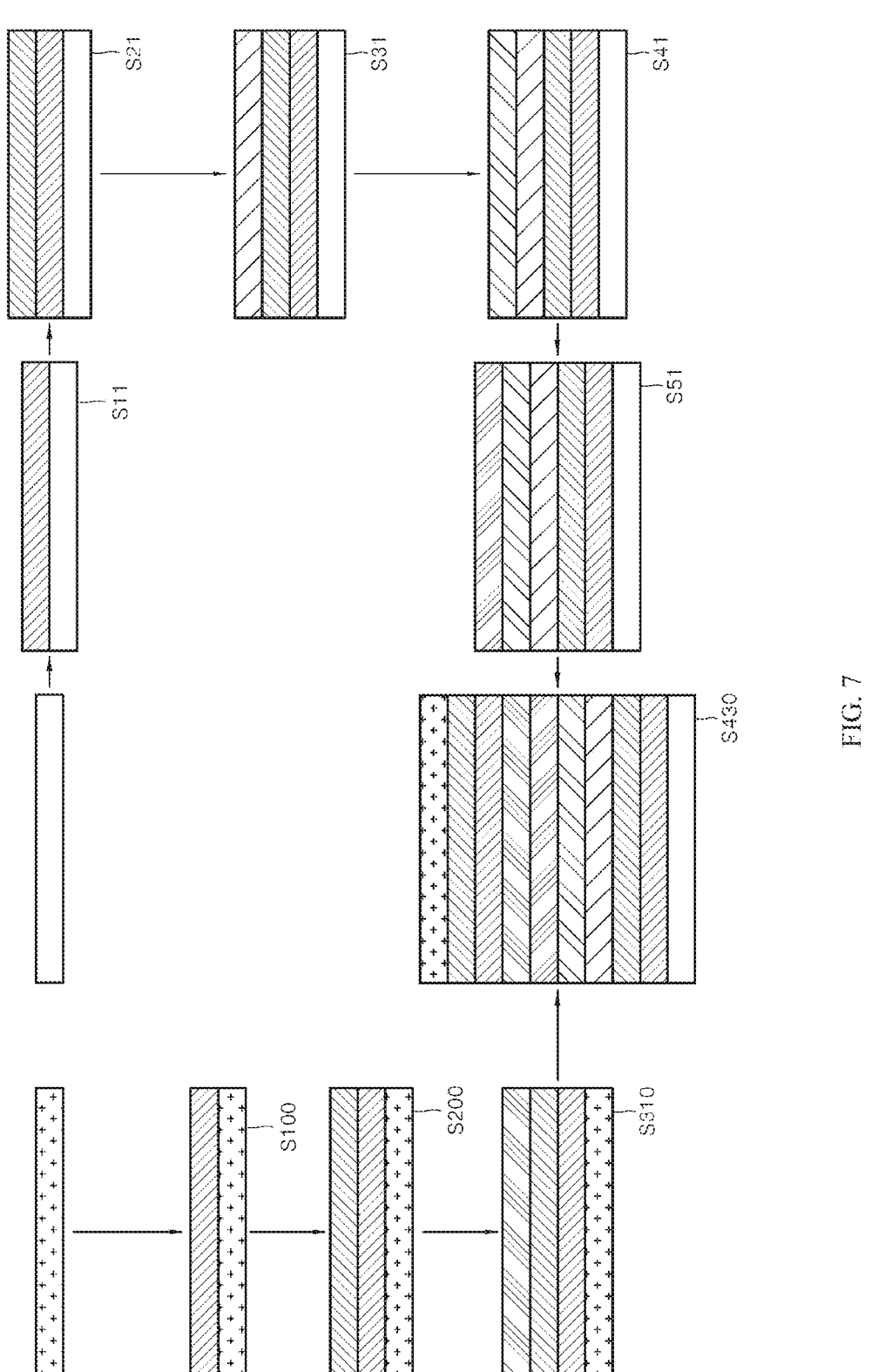
FIG. 7 schematically shows a method for manufacturing a perovskite optoelectronic device in which a structure in which graphene oxide is stacked on carbon nanotubes is included in each of upper and lower electrodes, and a first hole transport layer and a second hole transport layer are included in the device.

FIG. 7 schematically shows a method for manufacturing a perovskite optoelectronic device in which a structure in which graphene oxide is deposited on carbon nanotubes is included in each of the upper and lower electrodes, and in which a first hole transport layer and a second hole transport layer are included in the device.

Referring to FIG. 7, first, carbon nanotube, graphene oxide, an electron transport layer, and a light absorption layer including perovskite are sequentially stacked on a first substrate in S11, S21, S31 and S41.

Next, a first hole transport layer is formed on the light absorption layer in S51.

The first hole transport layer may be formed of Spiro-OMETAD (2,2',7,7'-tetrakis(N,N-di-p-methoxyphenylamino)-9,9'-spirobifluorene). The HOMO level of the Spiro-OMETAD (2,2',7,7'-tetrakis(N,N-di-p-methoxyphenylamino)-9,9'-spirobifluorene) is about 5.22 eV. This level is lower than the HOMO level of PEDOT:PSS (poly(3,4-ethylenedioxythiophene)poly(styrene sulfonate)) used as a hole transport layer. Accordingly, the Spiro-OMETAD bonded to the light absorption layer may lower the potential energy barrier for electrons formed in the metal-semiconductor coupling, thereby causing increase in the open circuit voltage and the fill factor.

The carbon nanotubes, the graphene oxide, the electron transport layer, the light absorption layer, and the first hole transport layer are sequentially stacked on the first substrate in S11, S21, S31, S41 and S51, thereby manufacturing the first stack.

Next, carbon nanotubes and graphene oxide are sequentially stacked on a second substrate in S100, S200, and S310, separately from the first stack.

Next, a second hole transport layer is formed on the graphene oxide in S310.

The second hole transport layer may be formed of PEDOT:PSS (poly(3,4-ethylenedioxythiophene)poly(styrene sulfonate)).

Thus, the second stack in which the carbon nanotubes, the graphene oxide, and the second hole transport layer are sequentially stacked on the second substrate may be manufactured in S100, S200, and S310.

Thereafter, the second stack is disposed over the first stack. Thus, the perovskite optoelectronic device in which a structure in which graphene oxide is deposited on carbon nanotubes is included in each of the upper and lower electrodes, and in which the first hole transport layer and the second hole transport layer are included in the device may be manufactured in S430.

EXAMPLES

Fabrication of Carbon Nanotube Film 0.5 wt % of single-walled carbon nanotube (SWCNT) were placed in an aqueous solution in which sodium dodecyl sulfate (SDS) was dissolved and dispersed therein using a tip sonicator for 20 minutes. Centrifugation was performed to separate impurities in the dispersion, and then about 80% of supernatant was extracted therefrom. The extracted dispersion passed through an anodic aluminum oxide (AAO) membrane filter to obtain a film. Excess distilled water passed through the film to remove SDS that may remain in the film during the filtering process. After the filtering was finished, the film was soaked in a water bath so that the film spontaneously floats on the water bath. After transferring the film floating on the water bath on a prepared substrate, drying was performed. The film was immersed in nitric acid (4 M) for 30 minutes to further remove traces of SDS.

Thereafter, drying was performed at 80 degrees C. for 30 minutes and washing was performed with excess distilled water, and then patterning was performed for application to an additional electrode.

Present Example 1

Replacing the Upper Electrode with Carbon Nanotube and Graphene Oxide

Manufacturing of staked film of substrate/lower electrode/electron transport layer/light absorption layer: ITO as a lower electrode was deposited on a glass substrate via sputtering. A thickness of the deposited ITO was 150 nm, and the ITO is used as a transparent electrode. An electron transport layer having a thickness of 60 nm was formed on the ITO electrode via vacuum thermal evaporation of $C_{60}$. A methylammonium lead halide ($MAPbI_3$) thin film of a thickness of 450 nm was deposited on the electron transport layer to form a light absorption layer.

Manufacturing of stacked film of substrate/upper electrode/hole transport layer: The manufactured carbon nanotube film was coated on a polyethylene naphthalate (PEN) substrate. Graphene oxide (GO) was formed on the film to reduce the surface roughness of the carbon nanotubes. The graphene oxide was synthesized from natural graphite via the Hummers' method. For uniform coating of the graphene oxide, 1 mg ml$^{-1}$ of dispersion having a volume ratio of methanol and distilled water of 2:1 was prepared. The graphene oxide was deposited on the film via spin coating and was dried at 80 degrees C. for 30 minutes to form a graphene oxide layer with a thickness of 1 nm or smaller. Thus, the upper electrode was manufactured.

A 100 nm thick layer of poly(3,4-ethylenedioxythiophene)polystyrene sulfonate (PEDOT:PSS) for smooth hole transport and bonding of the light absorption layer was coated on the upper electrode. A PEDOT:PSS solution used for the coating was modified based on Clevios AI 4083 solution. For uniform coating, the solution was diluted in a 1:2 volume ratio of methanol and distilled water. D-sorbitol was added at a concentration of 20 mg ml$^{-1}$ to the diluted solution to impart adhesion thereto. The modified PEDOT:PSS solution was spin-coated on the upper electrode to form a film. To completely remove the solvent remaining on the film, the film was dried at 120 degrees C. for 30 minutes to form a hole transport layer.

The stacked film of the substrate/lower electrode/electron transport layer/light absorption layer was brought into contact with the stacked film of the substrate/upper electrode/hole transport layer at 80 degrees C. to form a stack combination which was pressed lightly such that both were bonded to each other. Thus, a perovskite optoelectronic device was manufactured.

Present Example 2

Replacing the Upper Electrode with Carbon Nanotube and Graphene Oxide, and Replacing the Hole Transport Layer with the First and Second Hole Transport Layers Manufacturing of stacked film of substrate/lower electrode/electron transport layer/light absorption layer/hole transport layer: A stacked film of substrate/lower electrode/electron transport layer/light absorption layer was manufactured in the same process as that in Present Example 1. 2,2',7,7'-tetrakis[N,N-di(4-methoxyphenyl)amino]-9,9'-spirobifluorene (Spiro-OMeTAD) of a thickness of 150 nm was coated on the stacked film. Spiro-OMeTAD constitutes the first hole transport layer in the device.

Manufacturing of stacked film of substrate/upper electrode/hole transport layer: A stacked film of substrate/upper electrode/hole transport layer was manufactured in the same process as that in Present Example 1. However, in Present Example 2, PEDOT:PSS constitutes a second hole transport layer.

The stacked film of the substrate/lower electrode/electron transport layer/light absorption layer/light absorption layer/ the first hole transport layer and the stacked film of the substrate/upper electrode/the second hole transport layer were brought into contact with each other at 80 degrees C. to form a stack combination which was pressed lightly such that both were bonded to each other. Thus, a perovskite optoelectronic device was manufactured.

Present Example 3

Replacing the Lower Electrode with Carbon Nanotube and Graphene Oxide

A lower electrode was formed on a glass substrate by coating the carbon nanotube film and graphene oxide in Present Example 1 on the glass substrate. Polyethyleneimine (PEI) of a thickness of about 10 nm was coated on the lower electrode to form an electron transport layer. A solution used for the coating had 2 mg ml$^{-1}$ concentration, and PEI was used as a solute therein, and 2-methoxyethanol was used as a solvent therein. The solution was spin-coated on the lower electrode, and was dried at 100 degrees C. for 15 minutes to form the electron transport layer.

A methylammonium lead halide (MAPbI$_3$) thin film of a thickness of 450 nm was deposited on the electron transport layer to form a light absorption layer.

2,2',7,7'-tetrakis [N,N-di(4-methoxyphenyl)amino]-9,9'-spirobifluorene (Spiro-OMeTAD) of a thickness of 150 nm was coated on the light absorption layer. Spiro-OMeTAD constitutes a hole transport layer within the device.

An upper electrode was formed on the hole transport layer by coating a 100 nm thick gold thin film on the hole transport layer via a vacuum thermal evaporation process.

Present Example 4

Replacing the Upper Electrode and the Lower Electrode with Carbon Nanotube and Graphene Oxide, and Replacing the Hole Transport Layer with the First and Second Hole Transport Layers Manufacturing of stacked film of substrate/lower electrode/electron transport layer/light absorption layer/first hole transport layer: A stacked film of substrate/lower electrode/ electron transport layer/light absorption layer/first hole transport layer was manufactured in the same process as that in Present Example 3. However, in Present Example 4, Spiro-OMeTAD constitutes the first hole transport layer.

Manufacturing of stacked film of substrate/upper electrode/hole transport layer: A stacked film of substrate/upper electrode/hole transport layer was manufactured in the same process as that in Present Example 1. However, in Present Example 4, PEDOT:PSS acts as the second hole transport layer.

The stacked film of the substrate/lower electrode/electron transport layer/light absorption layer/light absorption layer/ first hole transport layer and the stacked film of the substrate/ upper electrode/the second hole transport layer were brought into contact with each other at 80 degrees C. to form a stack combination which was pressed lightly such that both were bonded to each other. Thus, a perovskite optoelectronic device was manufactured.

Comparative Example 1

A perovskite optoelectronic device was manufactured in the same manner as that in Present Example 2 except that the graphene oxide was not included in the upper electrode.

Comparative Example 2

A perovskite optoelectronic device was manufactured in the same manner as that in Present Example 3 except that graphene oxide was not included in the lower electrode.

Experimental Example—Performance evaluation for perovskite optoelectronic device To identify performance of each of the perovskite optoelectronic devices, an open circuit voltage ($V_{oc}$), a short circuit current density ($J_{sc}$), a fill factor (FF), and power conversion efficiency (PCE) of each of the perovskite optoelectronic devices in accordance with Present Examples 1 to 4 and Comparative Examples 1 to 2 in which carbon nanotube films of various thicknesses were used were measured. Measurement conditions were as follow: solar light simulation was performed with AM 1.5G sunlight produced by Oriel Sol3A solar simulator calibrated to 100 mWcm$^{-2}$ using standard Si solar cells (RC1000-TC-KG5-N, VLSI Standards). The measured results are shown in Table 1 below.

TABLE 1

| Examples | Thickness of CNT (nm) | $V_{oc}$ (V) | $J_{SC}$ (mA cm$^{-2}$) | FF (%) | PCE (%) |
|---|---|---|---|---|---|
| Present Example 1 | 25 | 1.00 | 20.0 | 57 | 11.4 |
| | 77 | 1.01 | 20.7 | 64 | 13.5 |
| Present Example 2 | 25 | 1.03 | 19.5 | 62 | 12.5 |
| | 77 | 1.04 | 20.6 | 67 | 14.5 |
| Present Example 3 | 11 | 1.02 | 18.6 | 58 | 10.9 |
| | 17 | 1.04 | 17.1 | 63 | 11.1 |
| | 25 | 1.03 | 15.1 | 65 | 10.2 |
| Present Example 4 | 17(lower electrode)/ 77(upper electrode) | 0.98 | 16.54 | 51 | 8.3 |
| Comparative Example 1 | 25 | 1.01 | 18.3 | 50 | 9.3 |
| | 77 | 1.02 | 19.3 | 62 | 12.1 |
| Comparative Example 2 | 11 | 0.99 | 18.1 | 45 | 8.1 |
| | 17 | 1.03 | 15.9 | 57 | 9.3 |
| | 25 | 1.02 | 14.9 | 60 | 9.1 |

Open circuit voltage ($V_{oc}$): means that a circuit is open, and means a potential difference across both opposing ends of a photovoltaic cell when the cell receives light in an infinite impedance state.

Short circuit current density ($J_{sc}$): means that the circuit is short-circuited, and means a current density in a reverse direction when the cell receives light under absence of external resistance.

Fill factor (FF): represents $V_{mp}$ (voltage value)$\cdot I_{mp}$ (current density)/$V_{oc}$ (open circuit voltage)×$I_{sc}$ (short circuit voltage) at a maximum power point.

Power conversion efficiency (PCE): refers to a ratio of output energy to energy incident from the sun and was measured under AM 1.5G daylight condition in a temperature range of 25 degrees C.

Referring to Table 1, the perovskite optoelectronic device manufactured with a carbon nanotube film of a thickness of 77 nm in Present Example 2 had an open circuit voltage of 1.04 V, a short circuit current density of 20.6 mA cm$^{-2}$, a fill factor of 67%, and power conversion efficiency of 14.5%. In contrast, the perovskite optoelectronic device manufactured with a carbon nanotube film of a thickness of 77 nm in Comparative Example 1 had an open circuit voltage of 1.02 V, a short circuit current density of 19.3 mA cm$^{-2}$, a fill factor of 62%, and power conversion efficiency of 12.1%. It may be identified that the perovskite optoelectronic device manufactured according to Present Example 2 had the open circuit voltage higher by 102%, the short circuit current density higher by 107%, the fill factor higher by 108%, and the power conversion efficiency higher by 120%, compared to the perovskite optoelectronic device manufactured according to Comparative Example 1.

Further, referring to Table 1, the perovskite optoelectronic device manufactured with a carbon nanotube film of a thickness of 17 nm in Present Example 3 had an open circuit voltage of 1.04 V, a short circuit current density of 17.1 mA cm$^{-2}$, and a fill factor of 63%, and power conversion efficiency of 11.1%. In contrast, the perovskite optoelectronic device manufactured with a carbon nanotube film of a thickness of 17 nm in Comparative Example 2 had an open circuit voltage of 1.03 V, a short circuit current density of 15.9 mA cm$^{-2}$, a fill factor of 57%, and power conversion efficiency of 9.3%. It may be identified that the perovskite optoelectronic device manufactured according to Present Example 3 had the open circuit voltage higher by 101%, the short circuit current density higher by 108%, the fill factor higher by 111%, and the power conversion efficiency higher by 119%, compared to the perovskite optoelectronic device manufactured according to Comparative Example 2.

That is, the perovskite optoelectronic device manufactured according to each of Present Example 2 and Present Example 3 includes a structure in which graphene oxide having an electron-withdrawing group (EWG) is deposited on carbon nanotubes. Thus, the device may have improved electrical conductivity.

FIG. 8 shows the measurement results of current density of the perovskite optoelectronic devices manufactured according to Present Example 1 to Present Example 4. In FIG. 8, in Present Example 1 and Present Example 2, the thickness of the carbon nanotube film is 77 nm. In Present Example 3, the thickness of the carbon nanotube film is 17 nm. In Present Example 4, the thickness of the carbon nanotube film is 17/77 nm. Referring to FIG. 8, a J-V curve of the perovskite optoelectronic device manufactured according to each of Present Example 3 and Present Example 4 is closer to a S-shape than a J-V curve of the perovskite optoelectronic device manufactured according to each of Present Example 1 and Present Example 2 is. This means that the perovskite optoelectronic device manufactured according to each of Present Example 1 and Present Example 2 has superior power conversion efficiency and electrical conductivity, compared to those of the perovskite optoelectronic device manufactured according to each of Present Example 3 and Present Example 4.

In particular, referring to FIG. 8, the J-V curve of the perovskite optoelectronic device manufactured according to Present Example 1 is closer to the S-shape than the J-V curve of the perovskite optoelectronic device manufactured according to Present Example 2 is. In other words, in the perovskite optoelectronic device manufactured according to Present Example 2, the Spiro-OMETAD is additionally introduced into the hole transport layer and is bonded to the light absorption layer, and lowers the potential energy barrier for electrons formed in the metal-semiconductor coupling, so that the open circuit voltage and the fill factor are increased.

In the above description, the present disclosure has been described based on the embodiments shown in the accompanying drawings. However, various changes or modifications may be made by those of ordinary skill in the art. Accordingly, it may be understood that such changes and modifications are included within the scope of the present disclosure as long as they do not depart from the scope of the present disclosure.

What is claimed is:

1. A perovskite optoelectronic device comprising:
a substrate;
a lower electrode disposed over the substrate;
an electron transport layer disposed over the lower electrode;
a light absorption layer disposed over the electron transport layer, the light absorption layer including perovskite;
a hole transport layer disposed over the light absorption layer; and
an upper electrode disposed over the hole transport layer,
wherein at least one of the lower electrode and the upper electrode includes graphene oxide deposited on carbon nanotubes,
wherein the lower electrode includes the graphene oxide stacked over the carbon nanotubes, and
wherein the carbon nanotubes in the lower electrode, the graphene oxide in the lower electrode, the electron transport layer, the light absorption layer, the hole transport layer and the upper electrode are sequentially stacked over the substrate.

2. The perovskite optoelectronic device of claim 1, wherein the electron transport layer comprises polyethyleneimine or a fullerene-based material.

3. The perovskite optoelectronic device of claim 1, wherein the hole transport layer comprises a p-type organic semiconductor or a conductive polymer material.

4. The perovskite optoelectronic device of claim 1, wherein the hole transport layer includes Spiro-OMETAD (2,2',7,7'-tetrakis (N,N-di-p-methoxyphenylamino)-9,9'-spirobifluorene) and PEDOT:PSS (poly(3,4-ethylenedioxythiophene)poly(styrene sulfonate)).

5. The perovskite optoelectronic device of claim 1, wherein the carbon nanotubes includes a single-walled carbon nanotube.

6. The perovskite optoelectronic device of claim 1, wherein the upper electrode includes the graphene oxide stacked over the carbon nanotubes.

7. The perovskite optoelectronic device of claim 1, wherein the upper electrode includes at least one or more of platinum (Pt), gold (Au), aluminum (Al), nickel (Ni), copper (Cu), silver (Ag), indium (In), ruthenium (Ru), palladium (Pd), rhodium (Rh), iridium (Ir) and osmium (Os).

8. The perovskite optoelectronic device of claim 4, wherein the lower electrode, the electron transport layer, the light absorption layer, the Spiro-OMETAD, the PEDOT:PSS, the graphene oxide, and the carbon nanotubes are sequentially stacked over the substrate.

9. The perovskite optoelectronic device of claim 1, wherein the perovskite optoelectronic device further comprises a substrate disposed over the upper electrode.

* * * * *